US005694384A

United States Patent [19]
Luster

[11] Patent Number: 5,694,384
[45] Date of Patent: Dec. 2, 1997

[54] METHOD AND SYSTEM FOR MEASURING KERR ROTATION OF MAGNETO-OPTICAL MEDIUM

[75] Inventor: Spencer D. Luster, Toledo, Ohio

[73] Assignee: Medar, Inc., Farmington Hills, Mich.

[21] Appl. No.: 704,453

[22] Filed: Aug. 27, 1996

[51] Int. Cl.$^6$ ................................. G11B 7/00; G01J 4/00
[52] U.S. Cl. ........................... 369/110; 369/124; 356/369
[58] Field of Search ............................. 369/53, 54, 58, 369/13, 99, 100, 110, 112, 124; 356/364, 366, 367, 368, 369

[56] References Cited

U.S. PATENT DOCUMENTS 5,119,352  6/1992  Bell, Jr. .
5,202,860  4/1993  Takahashi et al. ................ 369/13

OTHER PUBLICATIONS

"Ellipsometric Measurement of Magneto–Optical Kerr Rotation at Normal Incidence", By: Shiu Chao, et al. J. Appl. Phys. 67 (9), 1 May 1990, pp. 4241–4243.

Primary Examiner—Paul W. Huber
Attorney, Agent, or Firm—Brooks & Kushman P.C.

[57] ABSTRACT

First and second linearly polarized beams of light are incident on a magneto-optical disc at a common point. Both beams have equal or nearly equal intensity. Upon specular reflection from the disc, the first and second reflected beams travel through analyzers which are the same linear polarizers which originally polarized the second and first beams, respectively. The polarizers have an orientation such that the polarization angle between the first beam and the first polarizer is the same as the polarization angle between the second beam and the second polarizer. Consequently, the difference between the intensities of the two analyzed beams is proportional to Kerr rotation and independent of the direction of the stress axes of the magneto-optical disc substrate, and only mildly dependent on the magnitude of the retardation of the substrate.

9 Claims, 3 Drawing Sheets

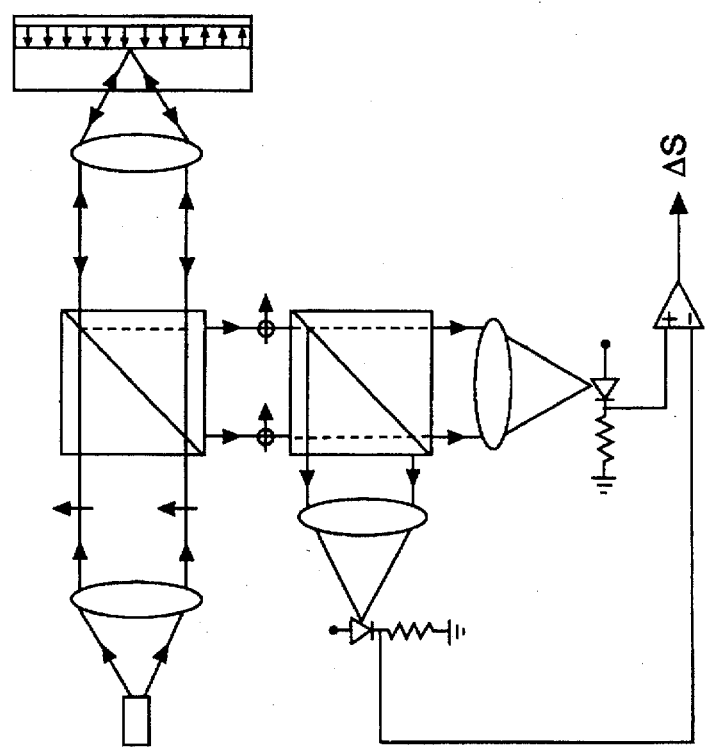
(PRIOR ART) Fig. 2
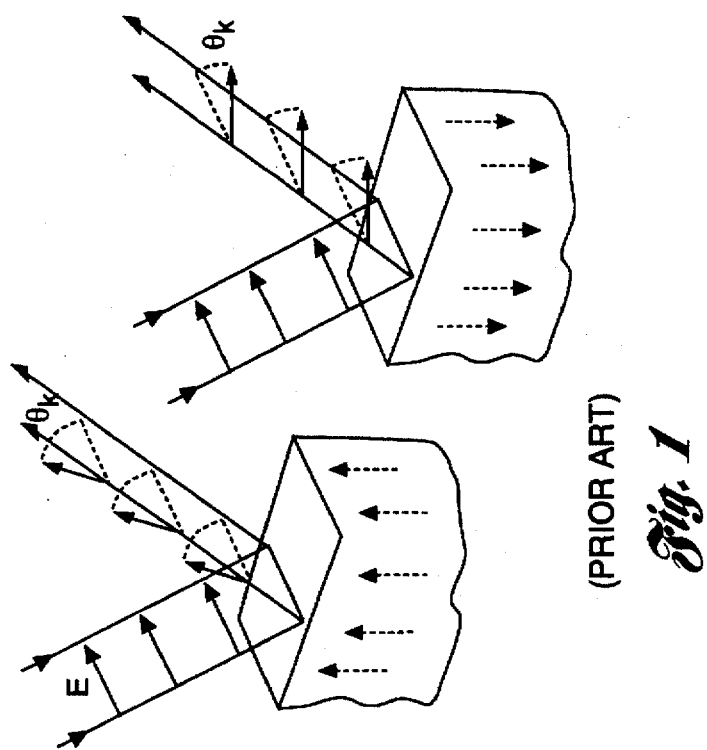
(PRIOR ART) Fig. 1

METHOD AND SYSTEM FOR MEASURING KERR ROTATION OF MAGNETO-OPTICAL MEDIUM

TECHNICAL FIELD

This invention relates to methods and systems for measuring Kerr rotation of magneto-optical medium and, in particular, to methods and systems for measuring Kerr rotation of magneto-optical discs using two beams of light.

BACKGROUND ART

Kerr effects occur when a light beam is reflected from a magnetooptic medium. The polar Kerr effect takes place when the magnetization is perpendicular to the plane of material. Upon reflection from such material, a linearly polarized beam of light will experience the introduction of a small vibration component that is orthogonal to its initial plane of vibration. That is, it will become slightly elliptically polarized. Additionally and more importantly, a rotation of this plane of vibration (the major axis of the ellipse) will be induced.

Magneto-optical (MO) disc data storage technology relies in part on the polar Kerr effect. Information in binary form is stored on the discs by virtue of the orientation of localized magnetizations in the MO layer. The orientation is either positively or negatively normal to the disc surface—either "up" or "down." In general, if a linearly polarized beam of light is incident on a magnetized disc (incidence angle or near normal), upon reflection from the disc a slight rotation of the polarization direction will be introduced as well as a very slight ellipticity of the polarization. If the orientation of the magnetization of the disc is "up", the induced rotation may be positive or counterclockwise. If the magnetization is "down", then the induced rotation will be negative or clockwise. The up or down direction corresponds directly or indirectly to the two binary states. With suitably designed analyzing optics and sensors, an MO disc reader can differentiate the two states.

A schematic representation of this phenomenon is illustrated in FIG. 1 which shows that if the polarization vector suffers a counterclockwise rotation upon reflection from an up-magnetized region, then the same vector will rotate clockwise when the magnetization is down. A magneto-optical medium is characterized in terms of its reflectivity R and its Kerr rotation angle $\theta_k$. R is a real number (between 0 and 1) that indicates the fraction of the incident power reflected back from the medium at normal incidence. $\theta_k$ is generally quoted as a positive number, but is understood to be positive or negative depending on the direction of magnetization; in MO readout, it is the sign of $\theta_k$ that carries the information about the state of magnetization, i.e., the recorded bit pattern.

FIG. 2 shows a conventional differential detection system that is the basis of magneto-optical readout in a number of erasable optical storage systems. A beam splitter (BS) diverts half of the reflected beam away from a laser and into a detection module.

The polarizing beam splitter (PBS) splits the beam into two parts, each carrying the projection of the incident polarization along one axis of the PBS. The component of polarization along one of the axes goes straight through, while the component along the other axis splits off and branches to the side. The PBS is oriented such that in the absence of the Kerr effect its two branches will receive equal amounts of light. In other words, if the polarization, upon reflection from the disc, did not undergo any rotations whatsoever, then the beam entering the PBS would be polarized at 45° to the PBS axes, in which case it would split equally between the two branches. Under this condition, the two detectors generate identical signals and a differential signal $\Delta S$ will be zero. Now, if the beam returns from the disc with its polarization rotated clockwise (rotation angle= $\theta_k$), then detector #1 will receive more light than detector #2, and the differential signal will be positive. Similarly, a counterclockwise rotation will generate a negative $\Delta S$. Thus, as the disc rotates under the focused spot, the electronic signal $\Delta S$ reproduces the pattern of magnetization along the scanned track.

U.S. Pat. No. 5,119,352 discloses a magneto optical head assembly which combines a single high extinction polarizing beam splitter utilized to separate and analyze a light beam and a pair of half-wave plates, each having a fast axis with respect to the polarization direction of light transmitted through the head assembly, with the angle of the fast axis of one of the half-wave plates preferably being equal but opposite that of the angle of the fast axis of the remaining half-wave plate. The system described therein uses two polarized beams and the attendant cross-propagation through the system. The resulting differential signal contains the Kerr-Angle-Only information.

Effects of Substrate Stress Birefringence

In general, an MO disc reader system is not designed to measure the actual Kerr rotation magnitude, just the rotation direction by virtue of the threshold electronics associated with the detector. Additionally, most MO disc thin film stacks are applied to dielectric substrates which have stress birefringence associated with them. In particular, polycarbonate is the most popular substrate material. Actual retardation (single pass) associated with the stress birefringence of polycarbonate substrates used in optical data storage discs is from 0 to 50 nanometers (nm). The Philips Redbook Specification states a reject limit of 50 nm for audio compact discs for example. These discs are also typically made using polycarbonate substrates.

Retardation caused by stress birefringence in the substrate can adversely affect the readability of an MO disc because the retardation can also introduce a rotation and ellipticity to the linearly polarized reader beam. In fact, the rotation introduced by even mild retardation (30 nm single pass for example) can be greater than the rotation due to the polar Kerr effect. As an example, a retarder (substrate) with 30 nm retardation and whose slow axis is off-parallel by only 4 degrees to the polarization direction of an input linearly polarized beam (780 nm beam wavelength) will, after reflection, have an induced rotation of approximately 0.5 degrees. This assumes that there is no Kerr rotation present. The typical magnitude of Kerr rotation for MO discs has been quoted as +/−0.3 to +/−1.2 degrees. Polycarbonate substrates for audio compact discs have been tested and it is found that while stress axes are oriented so as to be approximately parallel and perpendicular to radii of the discs, variations of +/−7 degrees are typical. There is little reason to suspect that substrates for MO discs behave in a more controlled fashion without special attention to the disc molding process.

While the polarization rotation associated with stress birefringence may typically be of the same or greater magnitude than the rotation associated with the polar Kerr effect, when reading the binary data, the frequency of the data stream is much greater than the typical variation in stress birefringence. Thus, a reader may separate the two effects by using a high pass filtering technique, then apply a threshold to the data in order to distinguish the binary states. Accurate measurement of the Kerr rotation, however, is not possible with such a simple method.

A method which is capable of making an accurate measurement of Kerr rotation in the presence of substrate retardation is presumed to be valuable for process control of MO disc production. In particular, application of the thin films which make up the MO stack might be better controlled if accurate Kerr angle measurements are available because the Kerr angle is critically and sensitively affected by changes in thin film thickness or composition. Additionally, such a method might lend itself to increased data storage and reading techniques. Data stored in more than two states—trinary, quaternary, up to full analogue— can provide a higher storage density than binary methods. Whether present or future MO films are capable of storing more than two states is unknown by the Applicant, but if they are, a method of reading this data will be required. It is in this arena where the substrate retardation could be particularly detrimental to accurate reading.

Compensator Methods for Eliminating Retardation Effects

There are methods of using a quarter wave retardation plate (compensator) to effectively separate the two rotation effects. These are generally considered ellipsometric measurements. Two recent examples of such methods are described by Shiuh Chao et al. in the paper entitled "Ellipsometric Measurement of Magneto-optical Kerr Rotation at Normal Incidence," J. APPL. PHYS. 67 (9), 1 May 1990, p. 4241–4243. All of these compensator methods are relatively slow in that they require iterative rotation of a compensator and a linear polarizer until a minimum of reflected light intensity is achieved. Measurement of the rotation angles of the compensator and polarizer will then yield sufficient information to calculate the Kerr angle. This is a slow process which also does not lend itself well to automation.

SUMMARY OF THE INVENTION

An object of the present invention is to provide a method and system for measuring Kerr rotation of magnetized medium in an automated and rapid fashion even in the presence of stress retardation.

Another object of the present invention is to provide a method and system for measuring Kerr rotation of magnetized medium without the need for wavelength sensitive devices.

Still another object of the invention is to provide a method and system for measuring Kerr rotation of magnetized medium through the use of a cross-propagation technique and linear polarizers.

In carrying out the above objects and other objects of the present invention, a method is provided for measuring Kerr rotation of magnetized medium. The method includes the steps of generating first and second beams of light, providing first and second spectrally insensitive polarizers to polarize the first and second beams of light, respectively, and delivering the first and second polarized beams of light to a magnetized spot on the medium to obtain first and second reflected beams of light. The method also includes the steps of analyzing the first and second reflected beams of light with the second and first polarizers, respectively, producing separate electrical signals based on the analyzed first and second beams of light and comparing the separate electrical signals to determine the Kerr rotation.

Preferably, the first and second polarized beams of light have substantially equal intensities and wherein the analyzed first and second beams of light have substantially equal polarization angles.

Further in carrying out the above objects and other objects of the present invention, a system is provided for carrying out the above method steps.

The present invention preferably uses only spectrally insensitive crystal polarizers. As such, wavelength is not an issue as with half-wave plates, given their spectrally sensitive nature wherein the light must be matched to the wave plate retardation value. The present invention can use a white light (incandescent lamp) source. This source is spectrally very broadband.

Through the use of the cross-propagation technique and linear polarizers of the present invention, the system is "self-aligning" and requires no such special care for proper assembly. This is contrary to the prior art which requires precision adjustment of the half-wave planes to achieve equal but opposite polarization rotations.

Additionally, the cost of selecting high wavelength precision laser sources can be avoided by using standard laser sources with the present invention. Such a cost savings might be considerable for mass-produced systems.

The above objects and other objects, features, and advantages of the present invention are readily apparent from the following detailed description of the best mode for carrying out the invention when taken in connection with the accompanying drawings.

BRIEF DESCRIPTION OF THE DRAWINGS

FIG. 1 is a schematic diagram illustrating the polar magneto-optical Kerr effect;

FIG. 2 is a schematic diagram of a differential detection system including a pair of polarizing beam splitters and two photodetectors for converting rotation of polarization to an electrical signal;

BEST MODE FOR CARRYING OUT THE INVENTION

In general, the method and system of the present invention isolates the Kerr rotation measurement from the effect of variation in the direction of the stress axes of the substrate. Additionally, the method and system greatly reduce the effect of the magnitude of the substrate retardation, at least within the domain of typical retardation values of 0 to 50 nm single pass.

Figure 3:
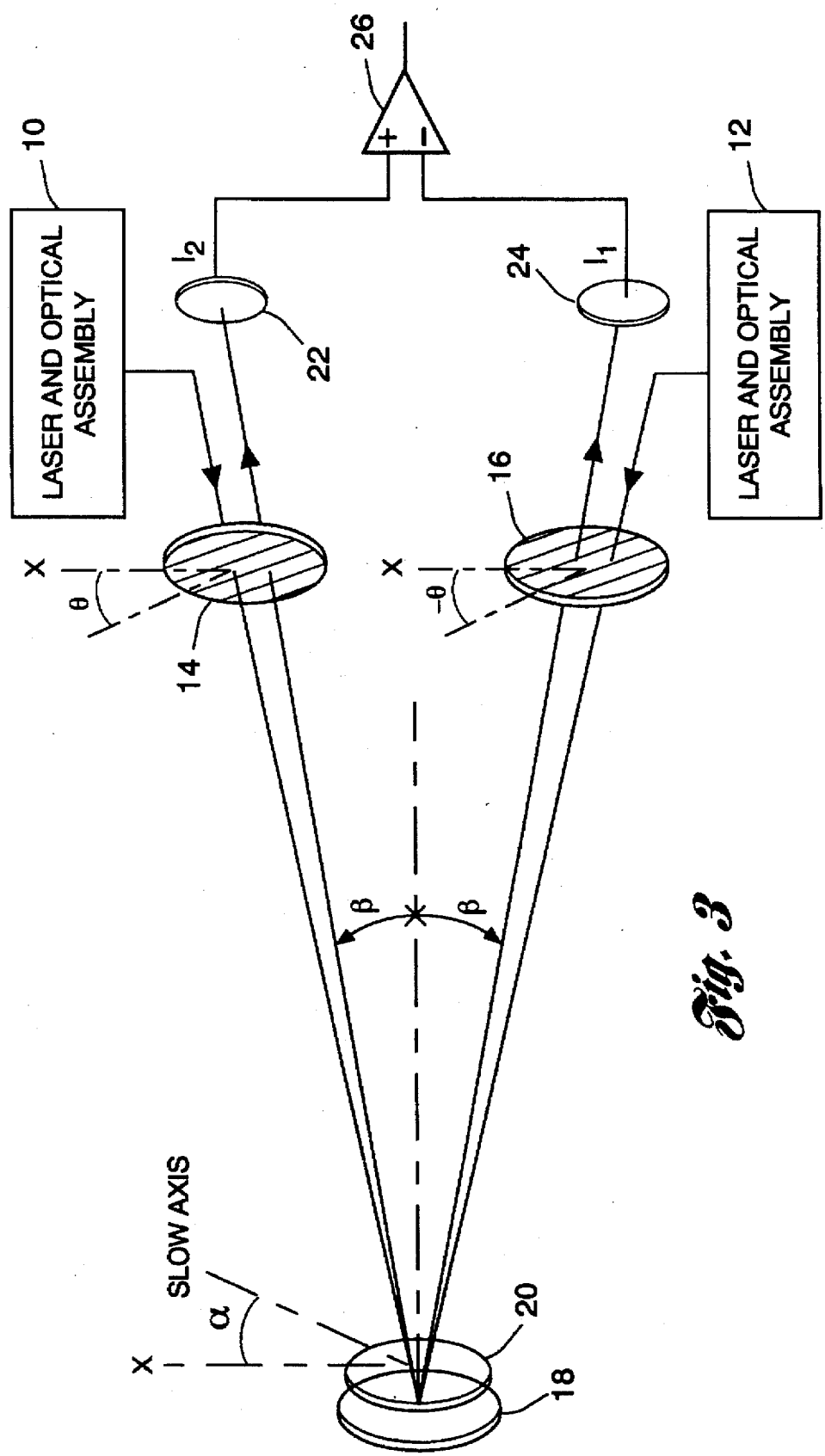
FIG. 3 is a schematic diagram of a system constructed in accordance with the present invention.

Referring now to FIG. 3, two linearly polarized beams of light, preferably created by first and second lasers and optical assemblies 10 and 12, respectively, and corresponding linear polarizers 14 and 16, respectively, are incident on an MO disc 18 at a common spot after passing through a retarder layer 20. Both beams $I_1$ and $I_2$ are at near normal incidence angle. The requirement that the incidence angle be near normal is to insure that the polar Kerr effect remains the dominant Kerr rotation mechanism. Additionally, both beams should have equal or nearly equal intensity. This intensity equivalence is an important element of the invention.

Upon specular reflection from the disc 18, both beams travel through analyzers which take the form of the linear polarizers 14 and 16 whose orientation is such that the polarization angle theta1 between $I_1$ and the first analyzer is the same as the polarization angle theta2 between $I_2$ and the second analyzer. This is a second important element of the invention, the equivalence of the magnitude of theta1 and theta2. The first and second beams then pass to their respective photodetectors 22 and 24 which, in turn, provide corresponding photocurrents which are compared by a comparator 26.

Under these conditions, the difference between the intensities of the two resultant beams, $I_1-I_2$, will be proportional to the Kerr rotation and independent of the direction of the stress axes of the substrate. Additionally, the value $I_1-I_2$ will only be slowly varying with the magnitude of the substrate retardation, at least within the 0 to 50 nm domain. In order to properly account for non-Kerr angle related variations in reflectance, the reciprocal of the sum $I_1+I_2$ should be used as a normalizing factor.

Figure 5:
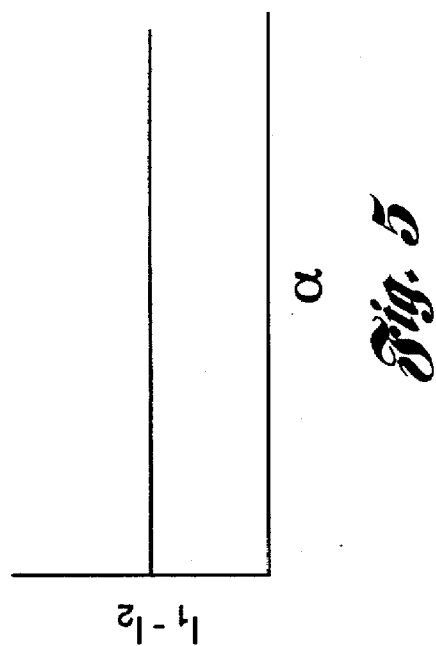
FIG. 5 is a graph of $I_1-I_2$ versus $\alpha$.
Figure 4:
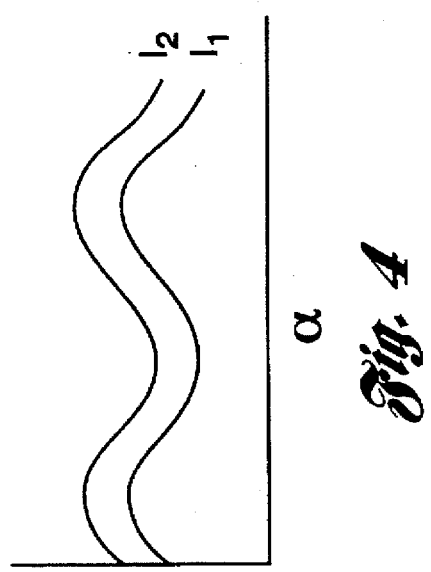
FIG. 4 are signals of photocurrents $I_1$ and $_2$ versus $\alpha$.

As shown in FIG. 3, only the two linear polarizers, 14 and 16, are required. In fact, this may be considered a key enhancement of the invention. The fact that the first polarizer 14 also serves as the second analyzer while the second polarizer 16 serves as the first analyzer insures the equivalence of the two angles theta1 and theta2. This not only eliminates the uncertainty about the equivalence of theta1 and theta2, but it greatly reduces the time required for proper assembly and alignment of the actual implementation of the measurement method. FIGS. 4 and 5 help to illustrate the relationship of $I_1$ and $I_2$.

Practical Considerations

Because the input beams should be of equal intensity and the reflected beams should also be of equal intensity, when there is no Kerr rotation or substrate retardation, there are several practical considerations for building a working device.

1. The two input beams should probably be generated from a single light source whose output spatial intensity distribution is invariant or nearly so. This would insure that if the output power of the light source varied over time, both beams would still have equal intensity.

2. Some means of "fine tuning" the equivalence of the two beams should probably be incorporated. This might take the form of an optical element such as a variable filter.

3. If two detectors such as detectors 22 and 24 are used to measure the reflected/analyzed beam intensities, care should be taken to insure that the response of the detectors 22 and 24 as well as the associated amplifying electronics are as nearly identical as is possible. Alternatively, a single detector might be used provided there is a reliable means of alternately chopping the two analyzed beams such that each beam intensity might be independently measured. For static measurements—no motion of the MO disc 18—the latter method might be preferred. Dynamic measurements might be best made with a two detector scheme. In this way, both beams will be "seeing" the same spot on the disc 18 even as the disc 18 moves (rotates). Such a scheme might be preferred especially if the invention is used to read data from the MO disc 18.

Experiments

Experiments were performed with a system including a single detector and a hand-operated beam blocker. The system used an incandescent light source and a light spot diameter at the target surface of ~1.5 mm. This is not to suggest that the tested system results should preclude the use of other light sources or much smaller or larger spot sizes.

Regarding the method's invariance with stress axis angle, the experimental results confirm this.

While a preferred embodiment of a particular device (one designed for measuring the Kerr angle of a very small area, for example) might use a laser in order to produce a small light spot, it is an advantage of this technique in general that a narrow band spectral source such as a laser is not required. An inspection system, for example, might be more practically constructed using a white light source without essentially changing any other aspect of the invention. Use of such a source in other Kerr angle measurement methods (such as the method described in U.S. Pat. No. 5,119,352, for example) is not practical because of the spectrally sensitive half wave required.

While the best mode for carrying out the invention has been described in detail, those familiar with the art to which this invention relates will recognize various alternative designs and embodiments for practicing the invention as defined by the following claims.

What is claimed is:

1. A method for measuring Kerr rotation of a magnetized medium, the method comprising the steps of:

generating first and second beams of light;

providing first and second spectrally insensitive polarizers to polarize the first and second beams of light, respectively;

delivering the first and second polarized beams of light to a magnetized spot on the medium to obtain first and second reflected beams of light;

analyzing the first and second reflected beams of light with the second and first polarizers, respectively, to obtain analyzed first and second beams of light;

producing separate electrical signals from the analyzed first and second beams of light; and comparing the separate electrical signals to determine the Kerr rotation.

2. The method as claimed in claim 1 wherein the first and second polarized beams have substantially equal intensities.

3. The method as claimed in claim 1 wherein the analyzed first and second beams of light have substantially equal polarization angles.

4. The method as claimed in claim 1 wherein the first and second reflected beams of light are non-parallel and non-orthogonal.

5. The method as claimed in claim 1 wherein the magnetized medium is a magneto-optical disc.

6. A system for measuring Kerr rotation of magnetized medium, the system comprising:

means for generating first and second beams of light;

first and second spectrally insensitive polarizers for polarizing the first and second beams of light, respectively, and delivering the first and second polarized beams of light to a magnetized spot on the medium to obtain first and second reflected beams of light and wherein the first and second polarizers analyze the second and first reflected beams of light, respectively, to obtain analyzed second and first beams of light, respectively;

at least one photodetector for measuring the intensity of the analyzed first and second beam of light, to obtain first and second electrical signals; and comparator means for comparing the first and second electrical signals to obtain a comparison signal representative of the Kerr rotation.

7. The system as claimed in claim 6 wherein the means for generating includes at least one light source.

8. The system as claimed in claim 6 wherein the first and second polarized beams having substantially equal intensities.

9. The system as claimed in claim 6 wherein the analyzed first and second beams of light have substantially equal polarization angles.

* * * * *